United States Patent
Olgaard et al.

(10) Patent No.: US 10,326,540 B2
(45) Date of Patent: Jun. 18, 2019

(54) METHOD FOR CONTROLLING WIRELESS DEVICE UNDER TEST USING NON-LINK TESTING RESOURCES

(71) Applicant: LitePoint Corporation, Sunnyvale, CA (US)

(72) Inventors: Christian Volf Olgaard, Saratoga, CA (US); Ruizu Wang, San Ramon, CA (US); Qinghui Luo, Shanghai (CN)

(73) Assignee: LitePoint Corporation, Sunnyvale, CA (US)

( * ) Notice: Subject to any disclaimer, the term of this patent is extended or adjusted under 35 U.S.C. 154(b) by 15 days.

(21) Appl. No.: 15/619,856

(22) Filed: Jun. 12, 2017

(65) Prior Publication Data

US 2018/0359170 A1    Dec. 13, 2018

(51) Int. Cl.
*H04B 17/15* (2015.01)
*H04L 12/26* (2006.01)
*G01R 31/3183* (2006.01)
*G01R 31/319* (2006.01)
*G01R 31/317* (2006.01)
(Continued)

(52) U.S. Cl.
CPC ........... *H04B 17/15* (2015.01); *G01R 31/319* (2013.01); *G01R 31/31701* (2013.01); *G01R 31/31725* (2013.01); *G01R 31/31926* (2013.01); *G01R 31/318371* (2013.01); *H04B 17/104* (2015.01); *H04B 17/29* (2015.01); *H04L 43/50* (2013.01); *H04W 24/06* (2013.01)

(58) Field of Classification Search
CPC ......... H04L 43/50; H04L 1/243; G01R 31/28; G01R 31/318508; G01R 31/318516; G01R 31/31725; H04B 17/15; H04B 17/29; H04B 17/104; H04B 17/364
See application file for complete search history.

(56) References Cited

U.S. PATENT DOCUMENTS

| | | | |
|---|---|---|---|
| 7,890,821 B2 * | 2/2011 | Music | G06F 11/261 370/242 |
| 8,391,160 B2 | 3/2013 | Olgaard et al. | |

(Continued)

OTHER PUBLICATIONS

Nov. 21, 2016—U.S. Appl. No. 15/357,013, filed Nov. 21, 2016.
(Continued)

*Primary Examiner* — Shelly A Chase
(74) *Attorney, Agent, or Firm* — Fountainhead Law Group P.C.

(57) ABSTRACT

A method for coordinating testing of a wireless device under test (DUT) using non-link testing resources. Coordination between the tester and DUT is achieved by transmitting, from the tester to the DUT, predetermined numbers of data packets associated with predetermined tester identification data (e.g., MAC addresses identifying the tester transmitter). During test phases involving measurement and/or calibration of DUT transmit signals, the tester sends a number of data packets associated with one or more versions of tester identification data, in response to which the DUT performs internal operations (e.g., revising transmit power offsets). During later test phases involving validation of DUT performance, the tester sends another number of data packets associated with one or more versions of the tester identification data to inform the DUT that its testing has passed or failed, and/or is to be repeated.

4 Claims, 4 Drawing Sheets

(51) Int. Cl.
    *H04B 17/10*      (2015.01)
    *H04B 17/29*      (2015.01)
    *H04W 24/06*      (2009.01)

(56) References Cited

U.S. PATENT DOCUMENTS

| | | |
|---|---|---|
| 8,913,504 B2 | 12/2014 | Olgaard et al. |
| 2007/0091814 A1* | 4/2007 | Leung .................... H04L 1/243 |
| | | 370/252 |
| 2011/0292809 A1 | 12/2011 | Olgaard et al. |
| 2012/0051224 A1 | 3/2012 | Olgaard et al. |
| 2012/0113829 A1 | 5/2012 | Olgaard et al. |
| 2013/0028100 A1 | 1/2013 | Olgaard |
| 2016/0352611 A1 | 12/2016 | Olgaard |

OTHER PUBLICATIONS

Korean Intellectual Property Office, International Searching Authority Search Report and Written Opinion dated Sep. 20, 2018, for International Application No. PCT/US2018/032107, Applicant, LitePoint Corporation, (13 pages).

* cited by examiner

METHOD FOR CONTROLLING WIRELESS DEVICE UNDER TEST USING NON-LINK TESTING RESOURCES

BACKGROUND

The present invention relates to testing of wireless devices, and in particular, to testing of wireless signal transceivers in non-link testing modes to reduce test times and communications required between the tester and device under test (DUT) during testing.

Many of today's electronic devices use wireless signal technologies for both connectivity and communications purposes. Because wireless devices transmit and receive electromagnetic energy, and because two or more wireless devices have the potential of interfering with the operations of one another by virtue of their signal frequencies and power spectral densities, these devices and their wireless signal technologies must adhere to various wireless signal technology standard specifications.

When designing such wireless devices, engineers take extra care to ensure that such devices will meet or exceed each of their included wireless signal technology prescribed standard-based specifications. Furthermore, when these devices are later being manufactured in quantity, they are tested to ensure that manufacturing defects will not cause improper operation, including their adherence to the included wireless signal technology standard-based specifications.

Testing of such wireless devices typically involves testing of the receiving and transmitting subsystems of the device under test (DUT). The testing system will send a prescribed sequence of test data packet signals to a DUT, e.g., using different frequencies, power levels, and/or signal modulation techniques to determine if the DUT receiving subsystem is operating properly. Similarly, the DUT will send test data packet signals at a variety of frequencies, power levels, and/or modulation techniques for reception and processing by the testing system to determine if the DUT transmitting subsystem is operating properly.

For testing these devices following their manufacture and assembly, current wireless device test systems typically employ testing systems having various subsystems for providing test signals to each device under test (DUT) and analyzing signals received from each DUT. Some systems (often referred to as "testers") include at least a vector signal generator (VSG) for providing the source signals to be transmitted to the DUT, and a vector signal analyzer (VSA) for analyzing signals produced by the DUT. The production of test signals by the VSG and signal analysis performed by the VSA are generally programmable (e.g., through use of an internal programmable controller or an external programmable controller such as a personal computer) so as to allow each to be used for testing a variety of devices for adherence to a variety of wireless signal technology standards with differing frequency ranges, bandwidths and signal modulation characteristics.

Ordinarily when testing a wireless device (e.g., a wireless fidelity (Wi-Fi), Bluetooth, Zigbee, Zwave or similar device) with a tester, once communications between tester and DUT have been established, the tester and DUT will execute a test flow during which the tester controls the behavior of the DUT by executing control commands via driver software associated with the DUT. Commands may include instructing the DUT to receive test packets from the tester, or to transmit packets to the tester. The characteristics of the packets may also be controlled, such as power level, frequency, data rate, modulation, etc.

Traditional methods of testing such devices are link-based, in which the tester interfaces the software stack of the DUT to establish a link as if the tester were a similar device. This approach can be advantageous inasmuch as it tests for software failures in addition to hardware failures and requires little if any code development for the tester to communicate with the DUT. In a production line, however, software tests are generally unnecessary, since target failures in such tests are due to manufacturing differences, which predominately affect only the hardware. Hence, the time needed to setup and teardown a connection (link) is essentially a wasted and costly resource.

SUMMARY

A method for coordinating testing of a wireless device under test (DUT) using non-link testing resources. Coordination between the tester and DUT is achieved by transmitting, from the tester to the DUT, predetermined numbers of data packets associated with predetermined tester identification data (e.g., MAC addresses identifying the tester transmitter). During test phases involving measurement and/or calibration of DUT transmit signals, the tester sends a number of data packets associated with one or more versions of tester identification data, in response to which the DUT performs internal operations (e.g., revising transmit power offsets). During later test phases involving validation of DUT performance, the tester sends another number of data packets associated with one or more versions of the tester identification data to inform the DUT that its testing has passed or failed, and/or is to be repeated.

In accordance with an exemplary embodiment of the presently claimed invention, a method for coordinating testing of a wireless device under test (DUT) includes:

receiving, with the DUT during a first predetermined time interval, a first data packet signal including first identification data corresponding to at least one of the DUT or a tester;

determining, with the DUT, a first number of data packets received during the first predetermined time interval in the first data packet signal; and performing, with the DUT, a DUT operation corresponding to at least the first number of data packets.

In accordance with another exemplary embodiment of the presently claimed invention, a method for confirming a test status of a wireless device under test (DUT) includes:

receiving, with the DUT during a first predetermined time interval, a first data packet signal including first identification data corresponding to at least one of the DUT or a tester;

determining, with the DUT, a first number of data packets received during the first predetermined time interval in the first data packet signal;

if the first number of data packets is greater than or equal to a first threshold number, identifying, with the DUT, a first test status of the DUT; and if the first number of data packets is less than the first threshold number, receiving, with the DUT during a second predetermined time interval, a second data packet signal including second identification data corresponding to at least one of the DUT or the tester, determining, with the DUT, a second number of data packets received during the second predetermined time interval in the second data packet signal, and if the second number of data packets is greater than a second threshold number, identifying, with the DUT, a second test status of the DUT.

In accordance with another exemplary embodiment of the presently claimed invention, a method for confirming a test status of a wireless device under test (DUT) includes:

receiving, with the DUT from a tester during each one of a plurality of predetermined time intervals, a respective one of a plurality of data packet signals including mutually exclusive identification data corresponding to at least one of the DUT or the tester;

determining, with the DUT, a respective number of data packets received during each one of the plurality of predetermined time intervals in the respective one of a plurality of data packet signals;

if a respective number of data packets received during one or more of the plurality of predetermined time intervals is greater than a corresponding threshold number, identifying, with the DUT, a corresponding test status of the DUT; and if no respective number of data packets received during one or more of the plurality of predetermined time intervals is greater than a corresponding threshold number, repeating, with the DUT, the receiving and determining.

In accordance with another exemplary embodiment of the presently claimed invention, a method for communicating, from a tester to a wireless device under test (DUT), a status of a test of the DUT includes:

determining, with the tester, one of a plurality of possible statuses of the test of the DUT;

setting identification data indicative of the determined status of the test of the DUT and corresponding to at least one of the DUT or the tester;

transmitting, with the tester, a data packet signal including a plurality of tester data packets and the identification data;

receiving, with the tester, a number of DUT data packets indicative of reception by the DUT of respective ones of the plurality of tester data packets;

repeating, with the tester, the transmitting and receiving if the received number of DUT data packets is less than a threshold number; and terminating, with the tester, the transmitting and receiving if the received number of DUT data packets is greater than or equal to the threshold number.

DETAILED DESCRIPTION

Figure 1:
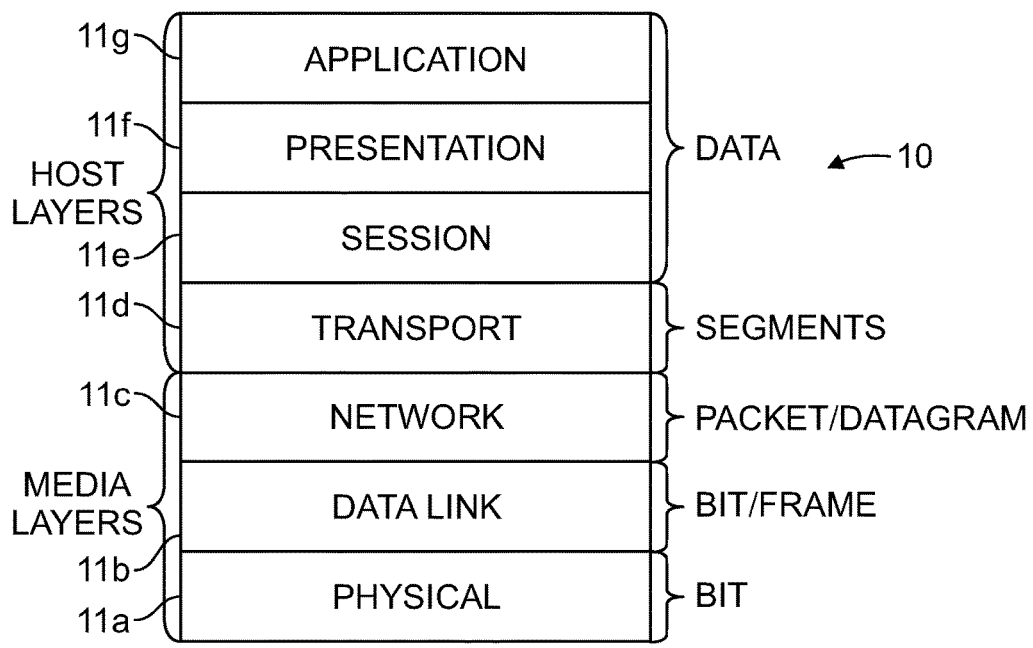
FIG. 1 depicts an exemplary representation of the Open Systems Interconnection (OSI) Reference Model stack.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, to the extent that the figures illustrate diagrams of the functional blocks of various embodiments, the functional blocks are not necessarily indicative of the division between hardware circuitry.

Wireless devices, such as cellphones, smartphones, tablets, etc., make use of standards-based technologies, such as IEEE 802.11a/b/g/n/ac ("Wi-Fi"), 3GPP LTE, Bluetooth, Zigbee, Zwave, etc. The standards that underlie these technologies are designed to provide reliable wireless connectivity and/or communications. The standards prescribe physical and higher-level specifications generally designed to be energy-efficient and to minimize interference among devices using the same or other technologies that are adjacent to or share the wireless spectrum.

Tests prescribed by these standards are meant to ensure that such devices are designed to conform to the standard-prescribed specifications, and that manufactured devices continue to conform to those prescribed specifications. Most devices are transceivers, containing at least one or more receivers and transmitters. Thus, the tests are intended to confirm whether the receivers and transmitters both conform. Tests of the receiver or receivers (RX tests) of a DUT typically involve a test system (tester) sending test packets to the receiver(s) and some way of determining how the DUT receiver(s) respond to those test packets. Transmitters of a DUT are tested by having them send packets to the test system, which then evaluates the physical characteristics of the signals sent by the DUT.

Testing of wireless devices, such as Wi-Fi, Bluetooth, Zigbee and Zwave devices, has progressed from frequent two-way messaging between a tester and device-under-test (DUT) to infrequent messaging between which major portions of test flows are executed within and coordinated between tester and DUT using non-link test solutions where only the unique device identifier and portions of the PHY are active. However, results of such tests would typically have been conveyed from DUT to tester via communications ports and pathways as the upper level of the protocol stack is not active, thereby preventing data from being easily conveyed in the transmitted packets. Therefore, where the only connection between a DUT and tester is either conducted or radiated signal paths and the data exchanged is via data packets, it may be difficult, if possible at all, for a DUT to convey test results to a tester using non-link test methods. As discussed in more detail below, in accordance with exemplary embodiments of the presently claimed invention, testing of a RF data packet transceiver can be performed, at least in part, by testing at lower layers of the network data packet signal communications protocol.

The following discussion is presented in a context of using Wi-Fi devices and their media access control (MAC) addresses as an example of the unique device identifier. However, it will be readily apparent to one of ordinary skill in the art of wireless data transceivers that such discussion is also applicable for Bluetooth devices for which a Bluetooth address or (BD_ADDR) is the unique device identifier, as well as Zigbee, Zwave and other similar devices.

Referring to FIG. 1, the Internet Protocol Suite has a networking model referred to as the Open Systems Interconnection (OSI) Model 10. This model 10 includes media layers and host layers, which, in turn, together include seven layers: physical 11a, data link 11b, network 11c, transport 11d, session 11e, presentation 11f, and application 11g.

The physical (PHY) layer 11a defines electrical and physical specifications of the data connection, and the protocol to establish and terminate a connection over the communications medium. It may also define a protocol for flow control, a protocol for providing connections between network nodes, and the modulation or conversion between the representation of digital data and corresponding signals transmitted over the physical communications channel.

The data link layer 11b provides reliable links between directly connected network nodes, e.g., by detecting and correcting errors that may occur in the physical layer 11a.

The network layer 11c provides functional and procedural means of transferring variable length data sequences (referred to as datagrams) between nodes within the same network (with the network being multiple connected nodes, each of which has an address and is permitted to transfer messages to other nodes by providing message content and the address of the designated node).

The transport layer 11d provides reliable conveyance of data packets between nodes with addresses located on a network, thereby providing reliable data transfer services to the upper layers. A common example of a transport layer protocol in the standard Internet protocol stack is TCP (Transmission Control Protocol), which is usually on top of the Internet protocol.

The session layer 11e controls connections (dialogues) between computers, by establishing, managing and terminating connections between local and remote applications. It provides for simplex, half-duplex or full-duplex operation, and establishes checkpointing, adjournment, termination and restart procedures.

The presentation layer 11f provides context between application layer entities, which may use different syntax and semantics. This layer also provides independence from data representation (e.g., encryption) by translating between application and network formats, thereby transforming data into the form the application will accept. This layer also formats and encrypts data to be sent across a network.

The application layer 11g is closest to the end user. Accordingly this layer 11g and the user interact directly with the software application. For example, this layer 11g interacts with software applications that implement communication components.

Where a tester and DUT engage in testing with infrequent control exchanges and the DUT executing test flows between those infrequent exchanges, it is common for the DUT to send test results to the tester so that the tester can conditionally progress with further testing of the DUT. Where the DUT has an I/O connection to the tester or the control processing system of the tester, conveying test results in such a manner is routine. However, where the only connection between the tester and DUT is either a conductive or radiative data packet signal path (where measurements are carried out) via which data packets are exchanged, conventional techniques offer no methods for effectively conveying test results from DUT to tester when using limited capability non-link testing methods. Such methods have become increasingly desirable as fewer battery powered devices include external ports for various reasons, including esthetics, needs for sealing against contamination or moisture, and/or minimizing potential for device hacking via a wired signal connection. Accordingly, in accordance with exemplary embodiments of the presently claimed invention, wireless testing methods advantageously use existing system features and protocols to communicate test results using conductive or radiative data packet signal paths via which the data packets are exchanged.

Figure 2:
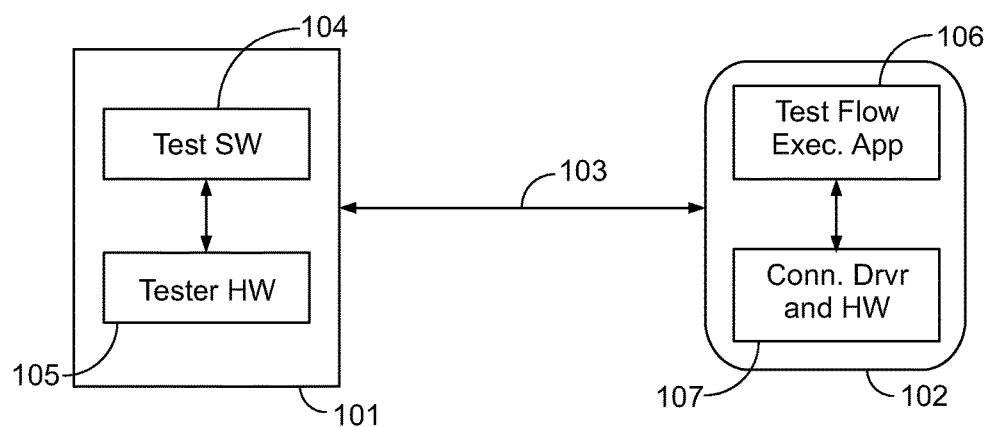
FIG. 2 depicts a testing environment in which the tester and DUT communicate via only a data packet signal path capable of conveying either conducted or radiated data packet signals.

Referring to FIG. 2, an exemplary testing environment is shown for testing using non-link test methodology via a single radio frequency (RF) signal connection 103 (conductive or radiative) between DUT 102 and tester 101. The tester 101 and DUT 102 follow respective predefined test flows. The tester 101 includes test hardware 105 (e.g., VSG and VSA) and test software 104 for execution by and/or for interaction with the test hardware 105. The DUT 102 includes a connectivity driver software (non-link mode) and hardware 107 and a test flow execution application 106 for controlling its testing by sending commands to the connectivity driver 107. For example, where the tester 101 is sending test data packets via the signal path 103 to the DUT 102, the DUT receiver (not shown) may be engaged in a bit-error rate (BER) and/or packet error rate (PER) test. At conclusion of the test, test results would ordinarily be sent by the DUT 102 to the tester 101 (a test specification for certification will often suggest this). In this testing environment, however, there is no separate I/O signal path for doing so. The only connection is via data packets sent or received via the data packet signal path 103. (Of course, since these data packets do include acknowledgement (ACK) packets, BER and/or PER can be readily determined also.)

Figure 3:
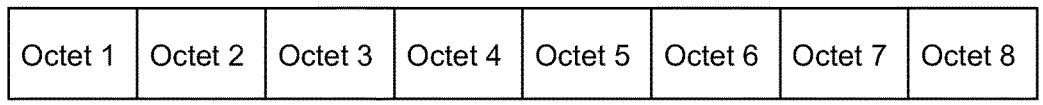
FIG. 3 depicts the eight octets of a data packet signal designated for data identifying a media access control (MAC) address.

Referring to FIG. 3, the series of data packets being communicated include a number of common and standard-specified features and/or characteristics, one of which is the MAC address that occupies eight octets (48 bytes) of the data packet signal. While MAC addresses are used in establishing and interacting in the link mode testing, they are also part of the PHY layer integrity during non-link mode testing, which requires, at a minimum, a destination MAC address (e.g., that of the tester during testing) and a source MAC address, which is the DUT MAC address. However, with a testing environment as depicted in FIG. 1, the DUT MAC address can be assigned by the user or device by being temporarily set to any desired value without affecting the PHY layer integrity. Accordingly, the MAC address can be used as a way to effectively convey up to 48-bytes of test commands and/or data. Then, following conveyance of such commands and/or data, the MAC address can be reset so that the DUT MAC address matches the destination MAC address used in subsequently received data packets arriving from the tester to ensure reception by the DUT. Hence, a temporarily unique MAC address can be specified by the driver 107 for conveyance of test results data when operating the DUT 102 during testing in a non-link mode.

In a "kickless" testing setup, the DUT 102 runs a predefined test flow which the tester 101 follows. (Such testing is referred to as "kickless" for the reason that it begins automatically upon occurrence of a normal internal condition of the DUT, thereby avoiding a need for an external stimulus, or "kick", to initiate a test flow.) As discussed in U.S. patent application Ser. No. 15/357,013, filed Nov. 21, 2016 (the disclosure of which is incorporated herein by reference), the DUT 102 can send data to the tester 101 through encoded MAC addresses, as made possible by using standard drivers in which generating of acknowledgement (ACK) packets is supported.

In accordance with exemplary embodiments of the presently claimed invention, it may also be desirable to send data from the tester 101 to the DUT 102. However, when limited to using non-link drivers (so as to avoid needing to develop and install special application-specific drivers), such tester-to-DUT data transmission is limited by the fact that only a small portion of the stack 10 is implemented, thereby limiting capabilities to decode packet payload data. Even in the simplest case in which it may only be needed to communicate with the DUT at the end of a test flow by informing the DUT that it either passed (PASS) or failed (FAIL) the test, or if the test should be repeated (RETRY), the need to address these three options (PASS, FAIL or RETRY) precludes a binary signaling scheme such as either sending a data packet (e.g., to indicate PASS) or not sending a data packet (e.g., to indicate FAIL). Further, such a signaling scheme in which an absence of a data packet transmission with reliance upon the DUT timing out is intended to communicate a specific condition or status is not robust.

Testing a DUT through use of such "kickless" software is advantageous since the software can easily be is reinstalled and once the DUT passes a test, it can remove the "kickless" driver and other related or associated files to ensure it cannot be enabled again, thereby preventing future interruptions or interference in normal device operations. As will be readily appreciated, removal of the software by default at the end of the flow is not desirable, since it would then not be possible to repeat a test (RETRY) when necessary without re-installing the driver. Further, such driver re-installation may not be possible under typical manufacturing test conditions where there are no connections or signal channels (either wired or wireless) available to enable software installations.

It is typically the case that the tester 101 operates faster (e.g., higher rates of data packet encoding by the VGA and decoding by the VSA) than the DUT 102. Accordingly, the tester can encode the state, condition, command, etc., in the number of packets it transmits for reception by the DUT. For example, a packet count of five (5) could be transmitted for PASS, a packet count of 10 could be transmitted for FAIL, and a packet count of 15 could be transmitted for RETRY. The specific numbers of data packets can be arbitrary, but preferably not consecutive so as to ensure more robustness based on larger differences between the numbers of data packets sent. As discussed in more detail below, the "kickless" software can cause the DUT to enable its receiver for one or more defined time intervals after which it queries the number of data packets received. By counting ACKs returned from the DUT, the tester can be limited to transmitting only the number of data packets necessary to communicate with the DUT.

In accordance with further exemplary embodiments, this technique can also be used to transfer a number (e.g., equal to or otherwise related to a number of data packets sent) to enable more complex return parameters, such as calibration parameter values. The parameters can be communicated as encoded data from the data packet count. If more than one value is to be transferred, multiple MAC addresses can be used by the DUT. For example, the DUT can start by receiving data packets using a first MAC address 1, read the received packet count, change to a second MAC address 2, read the received packet count, and so on. This technique can be particularly advantageous during calibration, implementation of offsets, etc., of the DUT during testing.

In accordance with further exemplary embodiments, the DUT can receive data packets using a first MAC address 1 during a first time interval, and if more than a predetermined number N of data packets are received, it is a transferred command. If such number N of data packets are not received, the DUT can move on to using a second MAC address 2 for receiving data packets during a second time interval. If a prescribed number of data packets are not received by then, the DUT can move on to using a third MAC address 3 during a third time interval. If, again, a prescribed number of data packets are not received by then, this process can be repeated by having the DUT return to using the first MAC address 1, and so on, until at least one of the prescribed numbers of data packets are received.

This advantageously allows the tester to initiate its data packet transmissions after the DUT has already started "listening" for them (e.g., in the event that more time is needed for a test pass or fail determination by the tester). The tester can continue transmitting with one of the MAC addresses (three in this example, but fewer or more can be used) until at least the prescribed number (>=N) of ACKs are received. If the ACKs from the DUT begin but then stop before reaching the prescribed number N, the tester can reset the count as this would likely be indicative of the DUT having moved to the next MAC address after not having received the prescribed number N of data packets from the tester during the associated time interval (of course, this would not be applicable if the number N is unity). Alternatively, the tester can maintain the current count while continuing to transmit using the same MAC address and then continue adding to the count when the DUT returns to using the same MAC address again after failing to receive the expected data packets with other MAC addresses. Accordingly, this enhances robustness by enabling the tester to initiate data packet transmissions at any point in time relative to the complementary operations of the DUT, while also enabling the "listening" or probing time by the DUT for each MAC address to be as brief as possible. This technique can be particularly advantageous during validation of the DUT to convey PASS/FAIL/RETRY to the DUT, e.g., to either repeat testing of the DUT or to terminate testing, in which case the DUT can remove the "kickless" driver and other files as noted above.

As a further alternative, the tester can transmit multiple sequences of data packets using multiple MAC addresses while counting ACKs received from the DUT in response. For example, two sequences of data packets may be transmitted using two MAC addresses, with the first used to establish or convey the intended message or data to the DUT, and the second used to confirm the first or to convey additional data to be used in combination (e.g., summed) with the earlier data.

Figure 4:
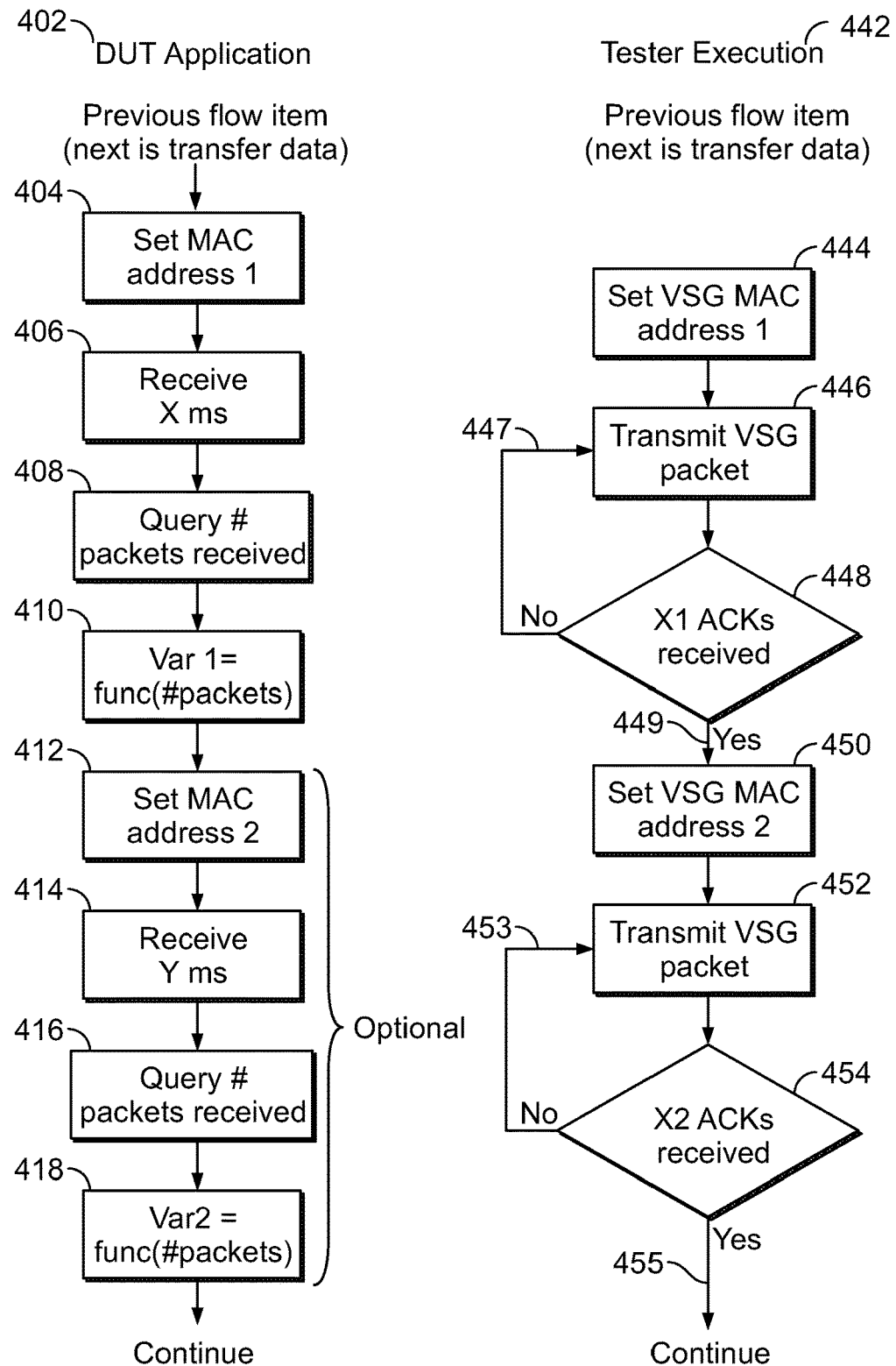
FIG. 4 depicts exemplary test flow diagrams for a manner in which a tester and a DUT and tester concurrently execute initiating and responsive actions, respectively, for internal operations of the DUT in accordance with exemplary embodiments of the presently claimed invention.

Referring to FIG. 4, exemplary complementary test flows of the DUT 402 and tester 442 for calibration during testing, as discussed above, may proceed as shown. As discussed above, the DUT and tester operate such that their complementary actions (e.g., the tester transmits prescribed numbers of data packets during different time intervals during at least some portions of which the DUT receives them and then interprets them as calibration commands and/or data) are at least partially contemporaneous during the time necessary for the tester to complete its communications to the DUT.

The DUT begins its operations by setting a MAC address 404 and "listens" by operating in a receive mode 406 for a prescribed time interval (e.g., X milliseconds), following which it determines a variable VAR1 408 identifying how many data packets were received. This variable VAR1 can be used by the "kickless" driver program 410 to calibrate the DUT. For example, such variable can be interpreted and used directly as an offset value for the nominal transmit signal power of the DUT.

Alternatively, as an option, the DUT can set another MAC address 412 and again "listen" by operating in a receive mode 414 for a prescribed time interval (e.g., Y milliseconds), following which it determines another variable VAR2 416 identifying how many additional data packets were received. This second variable VAR2 can also be used by the "kickless" driver program 418 either alone or in conjunction with the first variable VAR1 to calibrate the DUT. For example, the variable can be combined to define an offset value for the nominal transmit signal power of the DUT (e.g., offset=VAR1/VAR2).

Meanwhile, the tester begins its operations by setting its own MAC address 444 and then transmits data packets 446 while "listening" for ACKs returned by the DUT. The number of received ACKs are monitored 448. Until they reach a prescribed number X1, data packet transmission is repeated 447. Upon reaching the prescribed number X1, data packet transmission is terminated 449, and the tester sets another MAC address 450 and transmits data packets 452 while again "listening" for ACKs returned by the DUT. The number of received ACKs are again monitored 454, with data packet transmission repeating 453 until they reach a prescribed number X2, following which data packet transmission is terminated 455.

Figure 5:
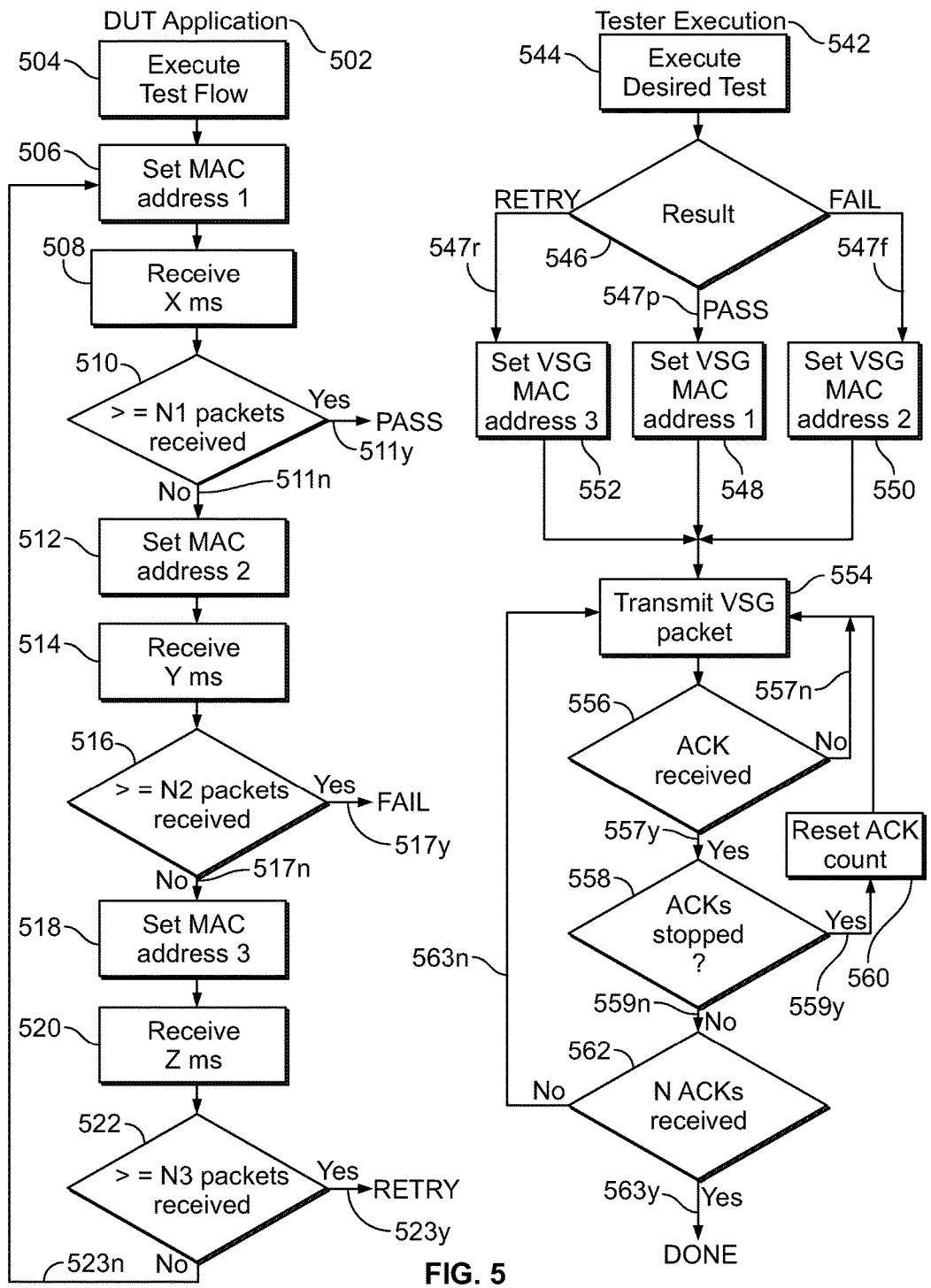
FIG. 5 depicts exemplary test flow diagrams for a manner in which a tester and a DUT concurrently execute respective actions for determining test status of the DUT and communicating such status to the DUT.

Referring to FIG. 5, exemplary complementary test flows of the DUT 502 and tester 542 for calibration during testing, as discussed above, may proceed as shown. As discussed above, the DUT and tester operate such that their complementary actions (e.g., the tester transmits prescribed numbers of data packets during different time intervals during at least some portions of which the DUT receives them and then interprets them as testing commands and/or validation) are at least partially contemporaneous during the time necessary for the tester to complete its communications to the DUT.

After executing its test flow 504 in accordance with the "kickless" driver program, the DUT continues its operations by setting a MAC address 506 and "listening" in a receive mode 508 for a prescribed time interval (e.g., X milliseconds), following which it determines whether a prescribed number (e.g., N1) of data packets have been received 510. If so 511$y$, the DUT test been successful (PASS) and the "kickless" driver program and related files can be removed.

If not 511$n$, the DUT continues by setting another MAC address 512 and "listening" in a receive mode 514 for another prescribed time interval (e.g., Y milliseconds), following which it determines whether another prescribed number (e.g., N2) of data packets have been received 516. If so 517$y$, the DUT test has not been successful (FAIL) and, preferably, the "kickless" driver program and related files are not yet removed pending any further instructions.

If not 517$n$, the DUT continues by setting another MAC address 518 and "listening" in a receive mode 520 for another prescribed time interval (e.g., Z milliseconds), following which it determines whether another prescribed number (e.g., N3) of data packets have been received 522. If so 523$y$, the DUT is thereby instructed to repeat the test (RETRY). Accordingly, the "kickless" driver program is restarted to repeat execution of the prescribed test flow 504.

Meanwhile, after execution of its test operations 544 in conjunction with the "kickless" driver program, the tester determines the result of the DUT test 546, i.e., whether it passed (PASS) or failed (FAIL), and/or whether it is to be repeated (RETRY). If it passed 547$p$ then the tester sets one MAC address 548, if it failed 547$f$ then the tester sets another MAC address 550, and if it is to be repeated 547$r$ then the tester sets yet another MAC address 552.

The tester then begins transmitting data packets 554 and monitoring received ACKs 556 from the DUT. If no ACKs are received 557$n$ (e.g., at least within a prescribed timeout interval), this is repeated. If, and so long as, ACKs are received 557$y$, the tester monitors their continued or discontinued reception 558. If the reception of ACKs terminates prematurely 559$y$, the received ACK count is reset 560 and data packet transmission 554 and ACK reception monitoring 556, 558 is repeated. Alternatively, the received ACK count can be maintained (i.e., not reset) as data packet transmissions continue while the tester waits for the DUT to return to use of the same MAC address and the received ACK count resumes. Otherwise, if the reception of ACKs continues 559$n$, the tester determines whether the cumulative number of received ACKs has reached a prescribed number N 562. If so 563$y$, then the tester has completed this portion of its operations. If not 563$n$, then the tester repeats data packet transmission 554 and ACK reception monitoring 556, 558, 562.

Various other modifications and alterations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method for coordinating testing of a wireless device under test (DUT), comprising:
   receiving, with said DUT during a first predetermined time interval, a first radio frequency (RF) data packet signal including first identification data corresponding to at least one of said DUT or a tester, wherein said first identification data comprises one of a MAC address or Bluetooth address for one of said DUT or said tester;
   determining, with said DUT, a first number of data packets received during said first predetermined time interval in said first RF data packet signal; and
   performing, with said DUT, a DUT operation corresponding to at least said first number of data packets and including at least one of transmitting a second RF data packet signal or receiving a third RF data packet signal.

2. A method for coordinating testing of a wireless device under test (DUT), comprising:

receiving, with said DUT during a first predetermined time interval, a first radio frequency (RF) data packet signal including first identification data corresponding to at least one of said DUT or a tester by decoding a portion of said first RF data packet signal including said first identification data to identify a wireless device address;

determining, with said DUT, a first number of data packets received during said first predetermined time interval in said first data packet signal; and performing, with said DUT, a DUT operation corresponding to at least said first number of data packets and including at least one of transmitting a second RF data packet signal or receiving a third RF data packet signal.

3. A method for coordinating testing of a wireless device under test (DUT), comprising:

receiving, with said DUT during a first predetermined time interval, a first radio frequency (RF) data packet signal including first identification data corresponding to at least one of said DUT or a tester;

determining, with said DUT, a first number of data packets received during said first predetermined time interval in said first data packet signal; and performing, with said DUT, a DUT operation corresponding to at least said first number of data packets by performing at least one test of one or more operations of said DUT including at least one of transmitting a second RF data packet signal or receiving a third RF data packet signal, and generating a plurality of test data corresponding to a result of said at least one test.

4. A method for coordinating testing of a wireless device under test (DUT), comprising:

receiving, with said DUT during a first predetermined time interval, a first radio frequency (RF) data packet signal including first identification data corresponding to at least one of said DUT or a tester;

determining, with said DUT, a first number of data packets received during said first predetermined time interval in said first data packet signal;

performing, with said DUT, a DUT operation corresponding to at least said first number of data packets and including at least one of transmitting a second RF data packet signal or receiving a third RF data packet signal;

receiving, with said DUT during a second predetermined time interval, a fourth RF data packet signal including second identification data corresponding to at least one of said DUT or said tester; and determining, with said DUT, a second number of data packets received during said second predetermined time interval in said fourth data packet signal;

wherein said performing, with said DUT, a DUT operation corresponding to at least said first number of data packets comprises performing, with said DUT, a DUT operation corresponding to at least said first and second numbers of data packets and including at least one of transmitting a fifth RF data packet signal or receiving a sixth RF data packet signal.

* * * * *